United States Patent [19]

Ohhashi et al.

[11] Patent Number: 5,081,354
[45] Date of Patent: Jan. 14, 1992

[54] METHOD OF DETERMINING THE POSITION OF ELECTRON BEAM IRRADIATION AND DEVICE USED IN SUCH METHOD

[75] Inventors: Toshiyuki Ohhashi, Katsuta; Kazuo Shii, Ibaraki; Hiroyuki Kobayashi, Mito, all of Japan

[73] Assignee: Hitachi, Ltd., Tokyo, Japan

[21] Appl. No.: 448,978

[22] Filed: Dec. 12, 1989

[30] Foreign Application Priority Data

Dec. 12, 1988 [JP] Japan ................... 63-313528

[51] Int. Cl.⁵ ............................................ H01J 37/26
[52] U.S. Cl. .................................. 250/311; 250/306; 250/307
[58] Field of Search ............... 250/311, 307, 310, 309, 250/397, 398

[56] References Cited

U.S. PATENT DOCUMENTS

| | | | |
|---|---|---|---|
| 4,091,374 | 5/1978 | Müller et al. | 250/311 |
| 4,097,740 | 6/1978 | Müller et al. | 250/311 |
| 4,169,240 | 9/1979 | Anderson et al. | 250/311 |
| 4,399,360 | 8/1983 | Fotino | 250/311 |
| 4,451,737 | 5/1984 | Isakozawa | 250/311 |
| 4,608,491 | 8/1986 | Kakubo | 250/311 |
| 4,788,425 | 11/1988 | Kobayashi | 250/311 |
| 4,866,273 | 9/1989 | Kobayashi et al. | 250/311 |
| 4,939,365 | 7/1990 | Kobayashi et al. | 250/311 |

FOREIGN PATENT DOCUMENTS

| | | | |
|---|---|---|---|
| 62-20229 | 1/1987 | Japan | 250/311 |
| 2208035A | 2/1989 | United Kingdom | 250/311 |

OTHER PUBLICATIONS

U. Gross et al., "The microprocessor-controlled CM12/STEM scanning transmission electron microscope", vol. 43, No. 10, Nov. 1987.

Primary Examiner—Jack I. Berman
Assistant Examiner—Kiet T. Nguyen
Attorney, Agent, or Firm—Antonelli, Terry, Stout & Kraus

[57] ABSTRACT

A method of positioning electron-beam irradiation and a device used in such method comprising the steps of irradiating a desired portion of a specimen with an electron beam, forming an image of the electron beam which penetrates the specimen on a fluorescent screen, and positioning the electron beam irradiation to the above-mentioned specimen on the basis of the image of the specimen on the fluorescent screen obtained by scanning an electron beam over a range wider than the spot size of the electron beam on the surface of the specimen.

11 Claims, 3 Drawing Sheets

F I G. 2A 
F I G. 2B 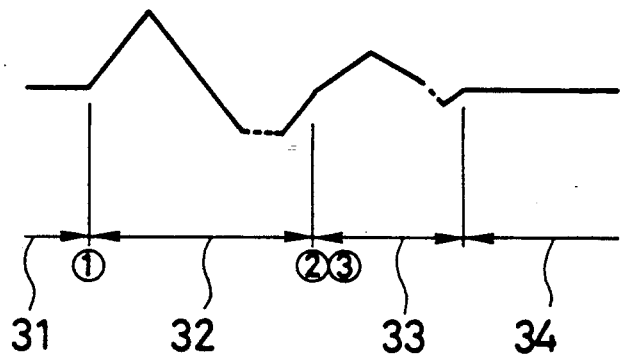
F I G. 3
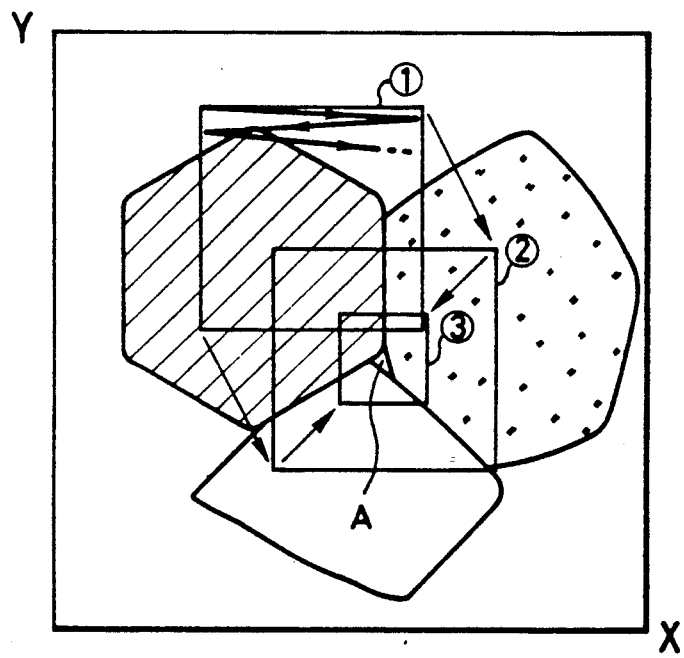

METHOD OF DETERMINING THE POSITION OF ELECTRON BEAM IRRADIATION AND DEVICE USED IN SUCH METHOD

BACKGROUND OF THE INVENTION

1. Field of the Invention

The present invention relates to an electron microscope and the like and more particularly to a method of positioning the electron beam irradiation and a device used in such method which enables a very small area to be analyzed so as to easily confirm the position of the portion of a specimen which has been irradiated.

2. Description of the Prior Art

In the past, very small area analysis under an electron microscope was carried out together with a scanning image observation device (Hitachi technical data EM sheet No. 28). As a very slender specimen has been used lately, resolution has become insufficient.

Thus, in recent years, a method in which an object lens is used during strong excitation and an electron beam is converged in its front magnetic field and image formation and an enlargement is made in the back magnetic field under a specimen has been used.

In this method, an analysis is made in such a way that while a specimen is being observed on a fluorescent screen in the condition that an electron beam is expanded, a portion of the specimen to be analyzed is positioned around the center of the fluorescent screen, the shape of a portion to be analyzed is remembered. After the electron beam is slenderly converged, the electron beam is moved to a remembered portion by a deflecting device.

The spot size of the electron beam at this time is several nm. Even if the electron beam is expanded on the order of one million times, this is merely several mm and it is very difficult to know which portion of a specimen is being seen.

Since an electron lens is used during strong excitation, even when the portion to be analyzed has been confirmed beforehand, the electron beam does not necessarily converge at the same place due to an influence such as the saturation of a magnetic path. Furthermore, in a portion of a specimen off an optical axis, the position of the image moves due to the convergence of an electron beam, with the result that it is unclear whether or not the electron beam has reliably irradiated the portion of a specimen to be analyzed.

As another example of the prior art, that of Japanese Unexamined Patent Publication No. 1-112648 can be cited. In this patent the position of a specimen is stored in an image memory (and data of the slight movements of a specimen) and displayed, and the position of an electron-beam probe is overlapped-and displayed on a display device. The example of Patent Unexamined Publication No. 63-213247 is one in which to make centering (the operation of aligning the center of a fluorescent screen with the center of electron beam) easy, A.C. waveforms are superimposed in either the X or Y directions. Japanese Patent Unexamined Publication No. 57-111938 is one in which focusing of a selected-field aperture decreased image is made easy. Japanese Patent Unexamined Publication No. 59-16256 relates to a specimen slight-movement device which converts the amount of a movement by an image shift (a device for electrically moving an image of a specimen) mechanically. U.S. Pat. No. 4,399,360 is one in which an image on a diaphragm provided in the lower part of a camera room is moved by applying a scanning signal voltage to a deflection electrode under a specimen, a signal is picked up by a detector under the diaphragm and the image of the specimen is displayed on a video display. U.S. Pat. No. 4,169,240 relates to auto focus of SEM and the like, in which high-frequency components of a video signal are picked up and the number of orders of a high-frequency filter is changed according to the number of frames used in auto focus. In all of the above examples of prior art, it is unclear whether or not the electron beam irradiates the portion of the specimen to be analyzed.

SUMMARY OF THE INVENTION

It is an object of the present invention to provide a method of positioning electron beam irradiation and a device used in such method which enables easy confirmation regarding which portion of a specimen is irradiated with a slenderly condensed electron beam and to provide an electron microscope.

In order to attain the above-mentioned objects, the method of positioning the electron-beam irradiation related to the present invention comprises the steps of irradiating a desired position with an electron beam, forming an image of the electron beam which penetrates this specimen on a fluorescent screen, and positioning electron-beam irradiation to the specimen on the basis of the image of the specimen on the above-mentioned fluorescent screen obtained by scanning an electron beam on the surface of the above-mentioned specimen over a range wider than the spot size of the electron beam. Scanning of an electron beam should preferably be performed by adding A.C. waveforms to the portion where the position of electron beam irradiation is set or by adding a magnetic field to a portion where the position of electron beam irradiation is set.

The device for positioning electron beam irradiation related to the present invention comprises a means for irradiating a desired position of a specimen with an electron beam generated from an electron-beam generation source, a means for forming an image of electron beam which penetrates the specimen to a fluorescent screen, a deflection coil for adjusting the position of the spot of an electron beam disposed in the front of the specimen on the flow path of the electron beam, a current supply means for supplying a current used to adjust the spot position of the electron beam irradiated to the specimen to the deflection coil, and a means for scanning the electron beam over a range wider than the spot size of the electron beam on the surface of the specimen. The means for scanning the electron beam should preferably be a means for adding A.C. waveforms to the portion where the position of electron beam irradiation to a specimen is set. The amplitude of the A.C. waveforms should preferably be variable. Or a means for scanning electron beam should preferably be a means for adding a magnetic field to the portion where the position of electron beam irradiation to a specimen is set. A means for adding a magnetic field should preferably comprise a deflection coil for scanning disposed separately from the above-mentioned deflection coil for adjusting the spot position, a current control circuit connected to the deflection coil used for scanning and an attenuator and an oscillator connected to the current control circuit.

An electron microscope related to the present invention has an irradiation lens for irradiating a specimen with an electron beam generated from an electron beam generation source, an electron beam deflection means provided in the back of the irradiation lens, a means for enlarging and forming an image of the electron beam which penetrates the specimen on a fluorescent screen and a means, provided on the above-mentioned electron beam deflection means, for adding an A.C. waveform to the deflection coil, where the amplitude of the A.C. waveform should preferably be variable.

The electron microscope related to the present invention has an electron beam generation source, an irradiation lens for irradiating a specimen with an electron beam generated from the electron beam generation source, an electron beam deflection means provided in the back of the irradiation lens, a means for enlarging and forming an image of the electron beam which penetrates the specimen on a fluorescent screen and a means for adding a magnetic field to a portion where the position of electron beam irradiation to a specimen is set.

According to the method and the device related to the present invention, by scanning an electron beam on the surface of a specimen, the image of a specimen wider than the spot size of the electron beam can be obtained on a fluorescent screen as an after image, thereby enabling the position at which an electron beam has been irradiated to be known easily. As a result of this, since the position of the electron beam irradiation can be known while observing the image of a specimen on a fluorescent screen, the position of the irradiation can be easily determined by moving the electron beam with the deflection device.

By using an electron microscope capable of obtaining an electron-beam diffraction image of a very small area by slenderly condensed electron beam on the surface of a specimen and capable of performing X-ray analysis, a measurement place can be confirmed easily while observing a range wider than the spot size of an electron beam by superposing an A.C. waveform or a magnetic field on an electron-beam deflector.

BRIEF DESCRIPTION OF THE DRAWINGS

FIGS. 2A and 2B are diagrams of an oscillation waveform at the time of spot position adjustment;

FIG. 3 is a conceptual view of a fluorescent screen at the time of spot position adjustment.

DETAILED DESCRIPTION OF THE PREFERRED EMBODIMENTS

Figure 1:
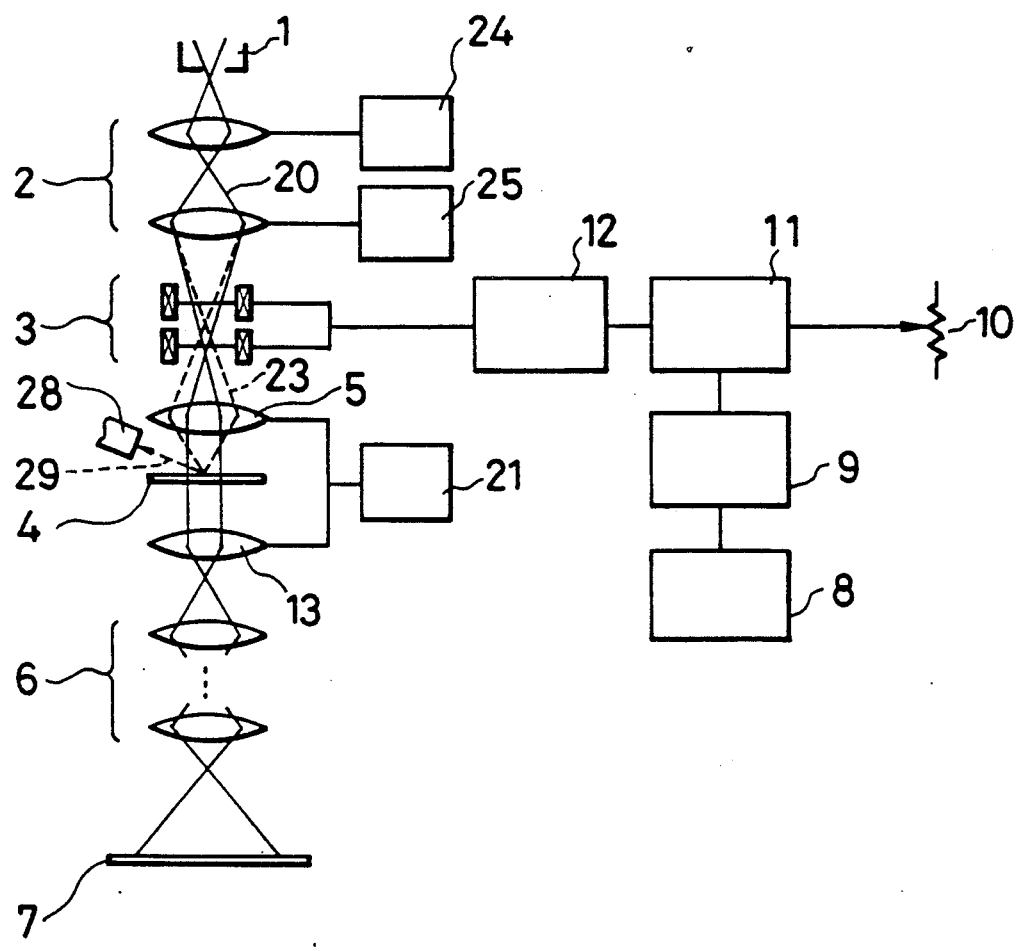
FIG. 1 is a view of the configuration of one embodiment of the present invention.

One embodiment of the present invention will be explained with reference to FIG. 1. An electron beam 20 is irradiated to a specimen 4 by an irradiation lens system 2 and an object lens 5. Shown in the figure are power supplies 24, 25 for the irradiation lens system. The image of an electron beam which penetrates the specimen 4 is expanded by an object lens 13 and an image-formation lens system 6 and is formed on a fluorescent screen 7. The object lenses 5 and 13 are structured to be usable during a strong excitation. The front magnetic field forms the object lens 5 and the back magnetic field forms the object lens 13. Shown in the figure is a power supply 21 for the above-mentioned lens 5 and 13. To obtain a clear image, an electron beam must be slenderly converged to increase the density of electrons, since the electron-beam image of a specimen is expanded several thousands to several millions of times. An electron beam must also irradiate the portion of the specimen which is to be expanded and image-formed. For this reason, an electron microscope is provided with a deflection coil 3 for adjusting the spot position of an electron beam over the specimen 4. By manually adjusting the input to a current control circuit 12 with a spot position adjustment control 10, the spot position of the electron beam irradiated to a specimen is adjusted in the X and Y directions. The triangle wave generated by an oscillator 8 is arranged so as to pass through an attenuator 9 and be added to the spot position value in an adder 11. In the attenuator 9, the A.C. current to be supplied to the deflection coil 3 is determined, including the correction to the accelerating voltage applied to an electron gun 1 and the correction of the magnification.

FIG. 2A shows one example of an A.C. waveform applied in the adder 11 in the X direction. FIG. 2B shows one example of an A.C. waveform applied in the Y direction. In this figure, a region 31 shows an observation process before an electron beam is scanned on the surface of a specimen, a region 32 shows a process of an adjustment in which an electron beam is scanned and the spot position is moved while observing the corresponding image of a specimen on a fluorescent screen. A region 33 shows a process of a fine adjustment of the spot position after the adjustment process. Lastly, a region 34 shows a detection process, such as an analysis, after the spot position adjustment is finished. Numerals ①  to ③ correspond to the same numerals in FIG. 3 as described hereinafter. FIG. 3 shows the movement of the electron beam on the fluorescent screen 7.

Next, the process of positioning an electron-beam irradiation will be explained together with reference to FIG. 3. Under the condition that an electron beam is expanded (a solid line 20 of FIG. 1), the position of a specimen is determined by moving the specimen so that an expanded image of a portion of the specimen to be analyzed is formed on the fluorescent screen 7. In this instance, the point A of FIG. 3 is the portion to be analyzed. After this, the spot size of the electron beam is slenderly condensed to a converged spot size to be analyzed by the power supplies 24 and 25. The broken line 23 of FIG. 1 shows the spot size of the electron beam which is condensed. Since the spot size of the electron beam is very small at this time, it cannot be confirmed which portion of the specimen 4 has been irradiated with an electron beam. However, by adding the output of the oscillator 8 to the deflection coil 3 via the attenuator 9, an electron beam can irradiate the specimen over a range wider than the spot size of the electron beam and an expanded image of the specimen can be seen on the fluorescent screen 7 (FIG. 3 ①). The irradiation center of the electron beam is moved with a spot position adjustment control 10 while observing the portion to be analyzed with the expanded image of the specimen (② of the same figure). After that, the amplitude of the triangle wave is reduced and fine adjustment of the irradiation center of the electron beam is made (③ of the same figure). As a result of this, the position of the electron beam irradiation can be aligned with the portion A where a specimen is to be analyzed. When a film is put on the position of the fluorescent screen 7 of FIG. 1, its image can be photographed (diffraction, etc.). As in FIG. 1, if an X-ray detector 28 is disposed in the vicinity of a specimen, analysis can be made by means of an X-ray 29 radiated from the above-mentioned portion A (energy dispersion X-ray, etc.). And it can also be used for electron energy loss spectroscopy.

Figure 4:
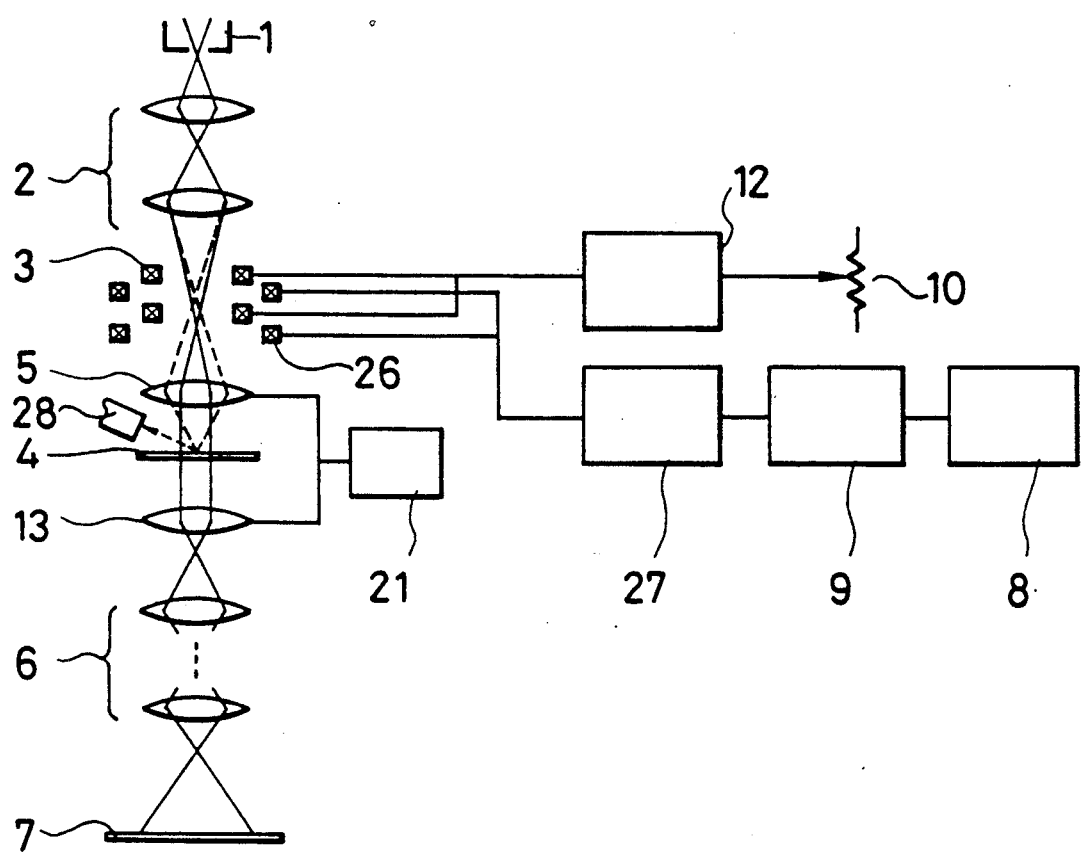
FIG. 4 is a view of the configuration of another embodiment of the present invention.

FIG. 4 is a configurational view illustrating another embodiment of a device for positioning electron beam irradiation related to the present invention. Another deflection coil 26 for scanning an electron beam is provided and to this are connected a current control circuit 27, an attenuator 9 and an oscillator 8 in series. In place of the addition of A.C. waveforms of the above-mentioned embodiment, the addition is made in the form of a magnetic field. The effects of the action are the same as for the above-mentioned embodiment, so the explanation of this action has been omitted.

In the above-mentioned embodiment, the oscillation waveform is a triangle waveform. However, it goes without saying that other waveforms (saw-wave, etc.) may be used.

There is no particular limitation on the oscillation frequency. But, considering the afterglow time of a fluorescent screen, one of 10 to 1000 Hz should be used. In order to obtain an A.C. waveform, an oscillator and an attenuator are combined. However, if the amplitude can be changed, other methods may be employed and furthermore maneuverability can be improved by using CPUs, etc.

As set forth above, according to the method of the present invention, even if the spot size is very small, the portion of the specimen to be analyzed can be determined. Therefore, a crystal structure about the same area of the spot size can be analyzed easily. As a result of this, the analysis accuracy of an electron microscope can be improved. According to the device for positioning electron beam irradiation of the present invention, the above-mentioned positioning method can be performed with a simple structure.

What is claimed is:

1. A method of positioning an electron beam, comprising the steps of:
   irradiating a desired portion of a specimen with an electron beam;
   forming an image of the electron beam which penetrates the specimen on a fluorescent screen;
   scanning the electron beam over a range wider than the spot size of the electron beam on the surface of the specimen to produce a scanned image of the specimen on the fluorescent screen; and
   positioning the electron beam on said specimen on the basis of the scanned image of the specimen on said fluorescent screen.

2. A method of positioning an electron beam according to claim 1, wherein the scanning of the electron beam is performed by adding an A.C. waveform to a deflection coil to scan the electron beam over a portion of the speciment where the electron beam is positioned.

3. A method of positioning an electron beam according to claim 1, wherein the scanning of the electron beam is performed by adding a magnetic field to a magnetic field produced by a deflection coil to scan the electron beam over a portion of the specimen where the electron beam is positioned.

4. An electron-beam positioning device, comprising:
   means for irradiating a desired portion of a specimen with an electron beam generated from an electron beam generation source;
   means for forming an image of the electron beam which penetrates said specimen on a fluorescent screen;
   a deflection coil for adjusting the position of the electron beam on the specimen in response to an adjustable current disposed in front of said specimen in the path of the electron beam;
   means for scanning the electron beam over a range wider than the spot size of the electron beam on the surface of said specimen to produce a scanned image of the specimen on the fluorescent screen; and
   means for supplying an adjustable current to the deflection coil, the adjustable current being adjusted to position the electron beam on the specimen on the basis of the scanned image of the specimen on the fluorescent screen.

5. An electron-beam positioning device according to claim 4, wherein the means for scanning the electron beam comprises means for adding an A.C. waveform to the adjustable current supplied to the deflection coil to scan the electron beam over a portion of the specimen where the electron beam is positioned.

6. An electron-beam positioning device according to claim 5, wherein the amplitude of the A.C. waveform is variable.

7. An electron-beam positioning device according to claim 4, wherein the means for scanning the electron beam comprises means for adding a magnetic field to a magnetic field generated by the deflection coil to scan the electron beam over a portion of the specimen where the electron beam is positioned.

8. An electron-beam positioning device according to claim 7, wherein the means for adding a magnetic field comprises a deflection coil used for scanning disposed separately from said deflection coil for adjusting the spot position, a current control circuit connected to the deflection coil used for scanning, an attenuator connected to the current control circuit, and an oscillator connected to the attenuator.

9. An electron microscope, comprising:
   an electron-beam generation source;
   an irradiation lens for irradiating a specimen with an electron beam generated from the electron-beam generation source;
   electron-beam deflection means, including a deflection coil, provided in back of the irradiation lens;
   means for expanding and forming an image of the electron beam which penetrates the specimen on a fluorescent screen;
   means for supplying an A.C. waveform to the deflection coil to scan the electron beam over a range wider than the spot size of the electron beam on the surface of the specimen to produce a scanned image of the specimen on the fluorescent screen; and
   means for supplying an adjustable current to the deflection coil, the adjustable current being adjusted to position the electron beam on the specimen on the basis of the scanned image of the specimen on the fluorescent screen.

10. An electron microscope according to claim 9, wherein the amplitude of the A.C. waveform is variable.

11. An electron microscope, comprising:
    an electron-beam generation source;
    an irradiation lens for irradiating a specimen with an electron beam generated from the electron-beam generation source;
    electron-beam deflection means provided in back of the irradiation lens;

means for expanding and forming an image of the electron beam which penetrates the specimen;

means for adding a magnetic field to a magnetic field generated by the electron-beam deflection means to scan the electron beam over a portion of the specimen where the electron beam is positioned to produce a scanned image of the specimen on the fluorescent screen; and means for supplying an adjustable current to the electron-beam deflection means, the adjustable current being adjusted to position the electron beam on the specimen on the basis of the scanned image of the specimen on the fluorescent screen.

* * * * *